United States Patent
Nam et al.

(10) Patent No.: US 7,670,957 B2
(45) Date of Patent: Mar. 2, 2010

(54) METHOD FOR FABRICATING SEMICONDUCTOR DEVICE

(75) Inventors: Ki-Won Nam, Kyoungki-do (KR); Kyung-Won Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 834 days.

(21) Appl. No.: 11/356,509

(22) Filed: Feb. 17, 2006

(65) Prior Publication Data
US 2006/0292886 A1  Dec. 28, 2006

(30) Foreign Application Priority Data
Jun. 28, 2005  (KR)  ............ 10-2005-0056381

(51) Int. Cl.
*H01L 21/302* (2006.01)
*H01L 21/461* (2006.01)
(52) U.S. Cl. ............ 438/710; 438/724; 438/725
(58) Field of Classification Search ........... 438/706, 438/710, 714, 723, 724, 725; 427/98.8
See application file for complete search history.

(56) References Cited

U.S. PATENT DOCUMENTS

| | | | | |
|---|---|---|---|---|
| 5,942,446 A | * | 8/1999 | Chen et al. | 438/734 |
| 5,981,341 A | * | 11/1999 | Kim et al. | 438/264 |
| 6,485,988 B2 | * | 11/2002 | Ma et al. | 438/3 |
| 6,630,407 B2 | * | 10/2003 | Keil et al. | 438/717 |
| 6,635,185 B2 | * | 10/2003 | Demmin et al. | 216/64 |
| 2003/0216031 A1 | * | 11/2003 | Komagata | 438/636 |
| 2005/0272232 A1 | * | 12/2005 | Nam | 438/585 |
| 2006/0084243 A1 | * | 4/2006 | Zhang et al. | 438/478 |
| 2006/0166416 A1 | * | 7/2006 | Dalton et al. | 438/153 |

FOREIGN PATENT DOCUMENTS

| | | |
|---|---|---|
| KR | 7-66176 | 3/1995 |
| KR | 1997-0077209 | 12/1997 |
| KR | 2000-0031235 | 6/2000 |
| KR | 2003-0058247 | 7/2003 |

* cited by examiner

*Primary Examiner*—Roberts Culbert
(74) *Attorney, Agent, or Firm*—Blakely, Sokoloff, Taylor & Zafman

(57) ABSTRACT

A method for fabricating a semiconductor device is provided. The method includes sequentially forming etch target layers, a hard mask layer and an anti-reflective coating layer, selectively etching the anti-reflective coating layer and the hard mask layer using a gas generating polymers, thereby increasing a line width of a bottom portion of the hard mask layer due to the polymers, and etching the etch target layers using a patterned hard mask layer with the increased line width.

7 Claims, 4 Drawing Sheets

METHOD FOR FABRICATING SEMICONDUCTOR DEVICE

FIELD OF THE INVENTION

The present invention relates to a semiconductor device fabrication technology; and more particularly, to a method for fabricating a semiconductor device.

DESCRIPTION OF RELATED ARTS

A semiconductor device has been micronized and highly integrated, and a size of the semiconductor device has also been reduced. Accordingly, in case of a dynamic random access memory (DRAM), a channel length of a cell transistor and a contact size are also decreased. Due to the decreased channel length, a design margin for an internal pressure is reduced and thus, a plug concentration cannot get higher. Due to the decreased contact size, an actual contact area is also reduced, thereby increasing a contact resistance. Furthermore, a driving current is also reduced due to the above described reasons and accordingly, a device degradation phenomenon such as a tWR fail of a semiconductor device and degradation in a refresh property are generated.

FIGS. 1A to 1C are cross-sectional views illustrating a conventional method for fabricating a semiconductor device.

As shown in FIG. 1A, a lower layer 102 is formed on a substrate 101.

Although not shown, the lower layer 102 is formed as follows.

First, a device isolation layer is formed on the substrate 101, which is divided into a cell region and a peripheral circuit region, thereby defining an active region of the substrate 101. A gate insulation layer is formed on the substrate 101.

Next, a gate conductive layer and a hard mask nitride layer are formed on the gate insulation layer and a photolithography process is performed thereon by using a gate mask pattern, thereby forming a gate structure.

Next, a lightly doped drain (LDD) ion-implantation process is performed on the substrate 101 exposed to both sides of the gate electrode and then, nitride-based spacers are formed on sidewalls of the gate electrode. Afterwards, a highly doped source/drain ion-implantation process is performed. The source/drain ion-implantation process is performed twice through a separate mask process to form a P-type metal oxide semiconductor (PMOS) transistor and an N-type metal oxide semiconductor (NMOS) transistor.

Next, a first inter-layer insulation layer is deposited over the above resultant structure. Then, a region in which a landing contact plug will be formed is opened through a photolithography process using a T-type or I-type landing plug contact mask. Afterwards, a polysilicon layer is formed over first inter-layer insulation layer. The polysilicon layer is planarized through a chemical mechanical polishing (CMP) process until the hard mask nitride layer is exposed, thereby forming the aforementioned landing contact plug.

Next, a second inter-layer insulation layer is formed over the above resultant structure, and a bit line contact hole is formed through a photolithography process using a bit line contact mask. Through the above sequential steps, the lower layer 102 is formed.

Next, a barrier metal layer 103, a tungsten layer 104, a first hard mask layer 105 formed of nitride, a second hard mask layer 106 formed of tungsten and serving a role in securing an etch margin, and an anti-reflective coating layer 107 are sequentially deposited over the bit line contact hole. Afterwards, a photoresist pattern 108 is formed on the anti-reflective coating layer 107.

Next, as shown in FIG. 1B, the anti-reflective coating layer 107, the second hard mask layer 106 and the first hard mask layer 105 are sequentially etched by using the photoresist pattern 108 as an etch barrier. Herein, reference numerals 107A, 106A, and 105A denote a patterned anti-reflective coating layer, a patterned second hard mask layer, and a patterned first hard mask layer, respectively.

Next, as shown in FIG. 1C, the photoresist pattern 108, the pattered anti-reflective coating layer 107A, and the patterned second hard mask layer 106A are removed. Afterwards, the tungsten layer 104 and the barrier metal layer 103 are etched by using the patterned first hard mask layer 105A as an etch barrier, thereby forming a bit line pattern. Herein, reference numerals 104A and 103A denote a patterned tungsten layer and a patterned barrier metal layer, respectively.

When forming the bit line pattern through the above described conventional method, the number of processes is increased because the second hard mask layer 106 is formed to secure an etch margin.

Furthermore, if the bit line pattern is formed through the conventional method, it may be difficult to obtain an effective line width of the bit line pattern. Thus, during formation of a contact hole for a subsequent metal line in the peripheral region, this contact hole is not aligned with an upper portion of the bit line pattern. Accordingly, a region adjacent to the bit line pattern may be damaged.

SUMMARY OF THE INVENTION

It is, therefore, an object of the present invention to provide a method for fabricating a semiconductor device capable of making a bit line pattern aligned with contact plug for a metal line by increasing a line width of the bit line pattern.

In accordance with one aspect of the present invention, there is provided a method for fabricating a semiconductor device, including: sequentially forming etch target layers, a hard mask layer and an anti-reflective coating layer; selectively etching the anti-reflective coating layer and the hard mask layer using a gas generating polymers, thereby increasing a line width of a bottom portion of the hard mask layer due to the polymers; and etching the etch target layers using a patterned hard mask layer with the increased line width.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 1A:
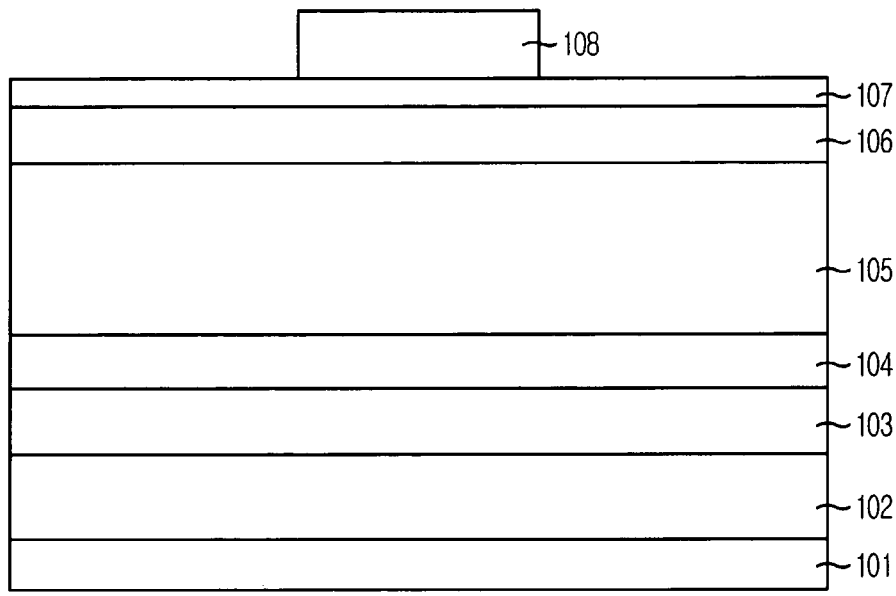
FIGS. 1A to 1C are cross-sectional views illustrating a conventional method for forming a semiconductor device.
Figure 1B:
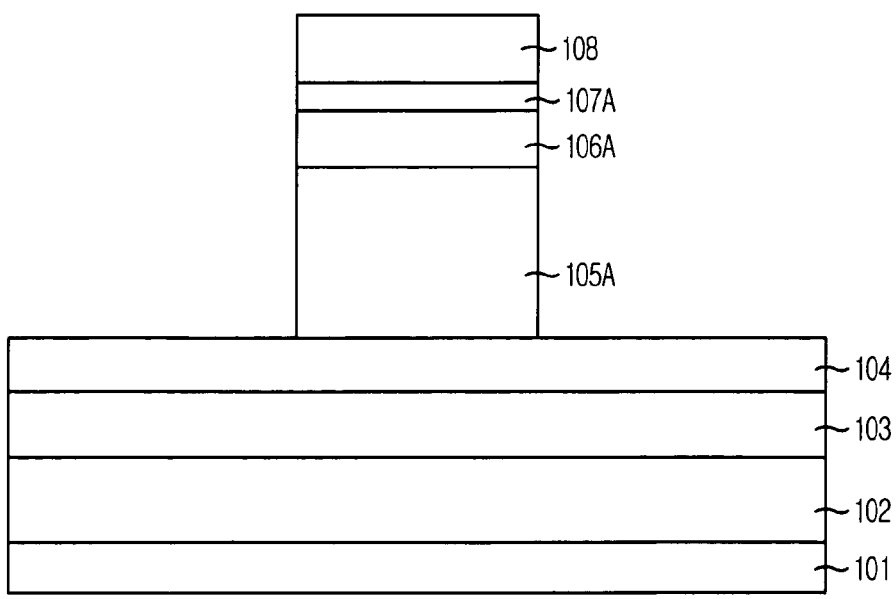
Figure 1C:
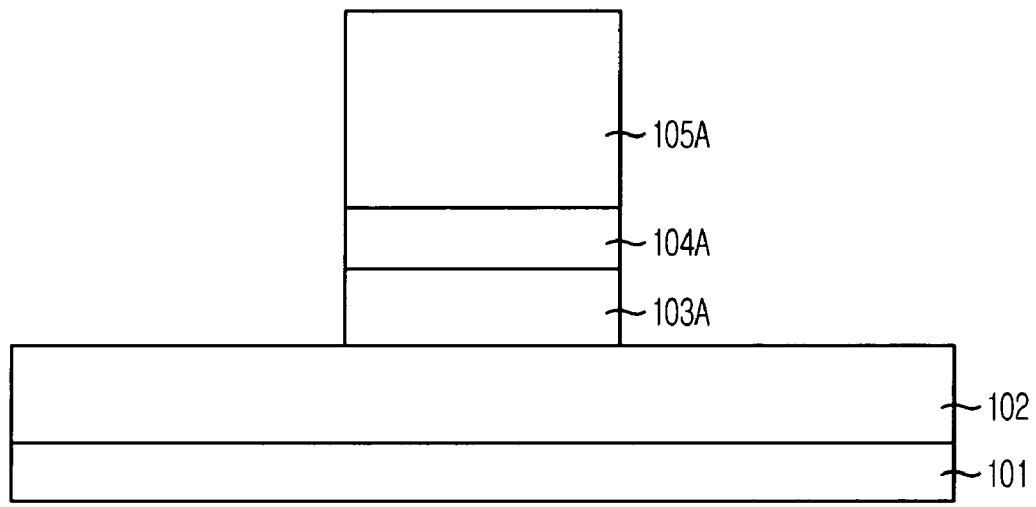
Figure 2A:
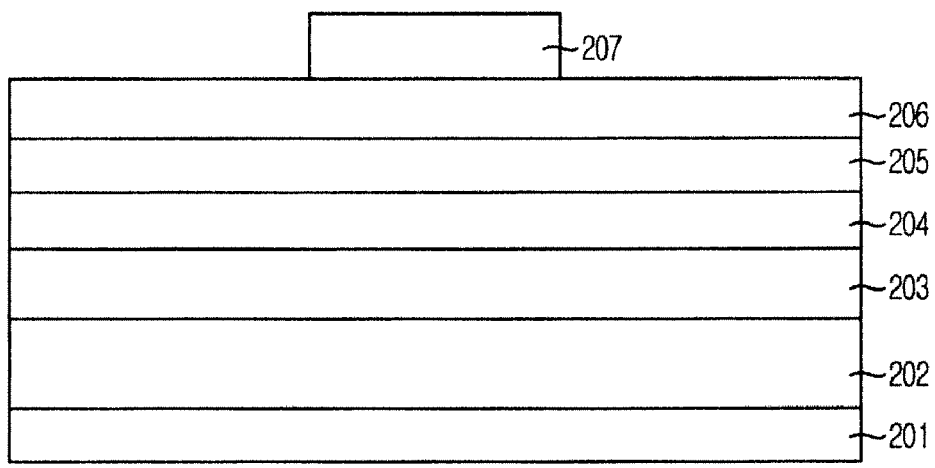
FIGS. 2A to 2C are cross-sectional views illustrating a method for fabricating a semiconductor device in accordance with a specific embodiment of the present invention.
Figure 2B:
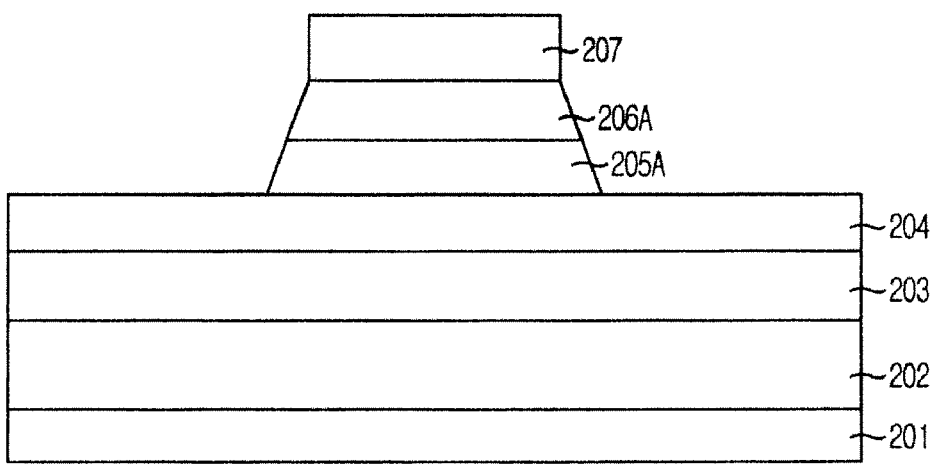
Figure 2C:
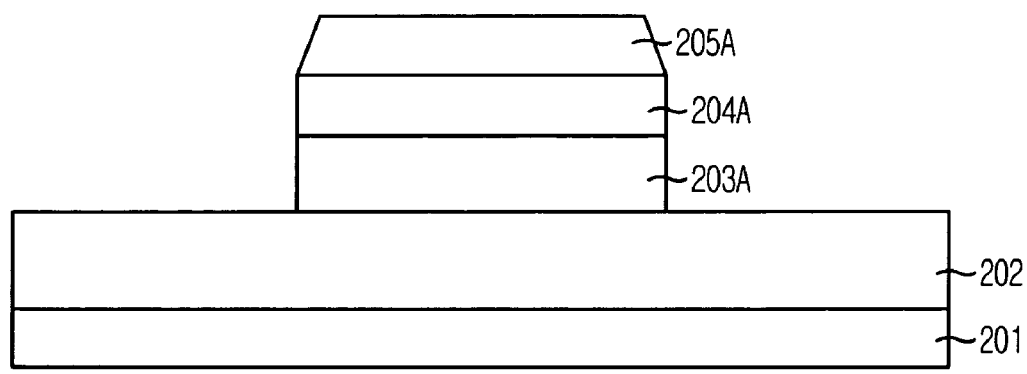

FIGS. 2A to 2C are cross-sectional views illustrating a method for fabricating a semiconductor device in accordance with a specific embodiment of the present invention.

As shown in FIG. 2A, a lower layer 202 is formed on a substrate 201.

Although not illustrated, the lower layer 202 is formed as follows.

First, a device isolation layer is formed on the substrate 201, which is divided into a cell region and a peripheral region, thereby defining an active region of the substrate 201. A gate insulation layer is formed on the substrate 201.

Next, a gate conductive layer and a hard mask nitride layer are formed on the gate insulation layer, and a photolithography process is performed thereon by using a gate mask pattern, thereby forming a gate structure.

Next, a lightly doped drain (LDD) ion-implantation process is performed on the substrate 201 exposed to both sides of the gate electrode and then, nitride-based spacers are formed on sidewalls of the gate electrode. Afterwards, a highly doped source/drain ion-implantation process is performed. The source/drain ion-implantation process is performed twice through a separate mask process to form a P-type metal oxide semiconductor (PMOS) transistor and an N-type metal oxide semiconductor (NMOS) transistor.

Next, a first inter-layer insulation layer is deposited over the above resultant structure. Then, a region in which a landing contact plug will be formed is opened through a photolithography process using a T-type or I-type plug contact mask.

etching process subjected to the hard mask nitride layer 205 uses a gas mixture obtained by mixing tetrafluoromethane ($CF_4$) gas or trifluoromethane ($CHF_3$) gas into $N_xH_y$ gas (herein, x and y representing atomic ratios are positive numbers), $C_xH_y$ gas (herein, x and y representing atomic ratios are positive numbers) or hydrogen ($H_2$) gas.

Also, the selective etching processes subjected to the anti-reflective coating layer 206 and the hard mask layer 205 can be performed under a process condition that a top electrode has a temperature ranging from approximately 100° C. to approximately 150° C. and a bottom electrode has a temperature ranging from approximately 30° C. to approximately 50° C.

At this time, during performing the etching process, the anti-reflective coating layer 206 and the hard mask layer 205 generate a lot of polymers. While the etching process is performed, the polymers are adsorbed on sidewalls of the patterned anti-reflective coating layer 206A and the patterned hard mask layer 205A and thus, a line width of the patterned hard mask layer 205A becomes larger than that of the photoresist pattern 207.

Table 1 illustrates a final inspection critical dimension (FICD) and a development inspection critical dimension (DICD) measured after etching the hard mask nitride layer 205 in the cell region and the peripheral circuit region.

TABLE 1

|  |  |  | 1 | 2 | 3 | 4 | 5 | Average | BIAS |
|---|---|---|---|---|---|---|---|---|---|
| Present Invention | DICD | Cell Region | 0.100 | 0.101 | 0.100 | 0.94 | 0.98 | 0.099 |  |
|  |  | Peripheral Region | 0.113 | 0.112 | 0.111 | 0.109 | 0.116 | 0.112 |  |
|  | FICD | Cell Region | 0.092 | 0.94 | 0.95 | 0.96 | 0.95 | 0.94 | −0.004 |
|  |  | Peripheral Region | 0.141 | 0.143 | 0.140 | 0.143 | 0.145 | 0.142 | 0.030 |
| Conventional Method | DICD | Cell Region | 0.080 | 0.083 | 0.078 | 0.077 | 0.078 | 0.079 |  |
|  |  | Peripheral Region | 0.210 | 0.209 | 0.210 | 0.204 | 0.204 | 0.207 |  |
|  | FICD | Cell Region | 0.065 | 0.068 | 0.073 | 0.069 | 0.069 | 0.069 | −0.010 |
|  |  | Peripheral Region | 0.195 | 0.193 | 0.199 | 0.191 | 0.191 | 0.194 | −0.014 |

Afterwards, a polysilicon layer is deposited over the first inter-layer insulation layer. Then, the polysilicon layer is planarized through a chemical mechanical polishing (CMP) process until the hard mask nitride layer is exposed, thereby forming the aforementioned landing contact plug.

Next, a second inter-layer insulation layer is deposited over the above resultant structure, and a bit line contact hole is formed through a photolithography process using a bit line contact mask. Through the above sequential steps, the lower layer is formed 202.

Next, a barrier metal layer 203 and a tungsten layer 204 are deposited on the bit line contact hole as etch target layers.

Next, a hard mask layer 205 formed of nitride and an anti-reflective coating layer 206 are sequentially formed on the tungsten layer 204. Afterwards, a photoresist pattern 207 is formed over the anti-reflective coating layer 206.

Next, as shown in FIG. 2B, the anti-reflective coating layer 206 and the hard mask layer 205 are sequentially etched by using the photoresist pattern 207 as an etch barrier. Herein, reference numerals 206A and 205A denote a patterned anti-reflective coating layer and a patterned hard mask layer, respectively.

The etching process subjected to the anti-reflective coating layer 206 uses a gas mixture obtained by mixing nitrogen ($N_2$) gas, oxygen ($O_2$) gas and carbon monoxide (CO) gas, and the At this time, if examining the bias obtained by subtracting the value of DICD from the value of FICD, in accordance with the conventional process of forming the semiconductor device, the bias is approximately −0.010 in the cell region, and the bias is approximately −0.014 in the peripheral region.

Compared to the conventional process, in accordance with the specific embodiment of the present invention, the bias is decreased to approximately −0.004 in the cell region, and the bias is increased to approximately 0.030 in the peripheral region.

As described above, a line width of a bit line in the peripheral region is increased and thus, it becomes possible to solve mis-alignment defect during formation of a contact hole for a subsequent metal line.

Next, as shown in FIG. 2C, after removing the photoresist pattern 207 and the patterned anti-reflective coating layer 206A, the tungsten layer 204 and the barrier metal layer 203 are etched by using the patterned hard mask layer 205A, thereby forming a bit line. Herein, reference numerals 204A and 203A denote a patterned tungsten layer and a patterned barrier metal layer.

In accordance with the specific embodiment of the present invention, the hard mask made of tungsten used in the conventional method is omitted herein, and the line width of the bit line pattern is increased by using polymers generated during the etching process.

Accordingly, it is possible to obtain the bit line pattern precisely aligned with a subsequent metal interconnection contact plug.

As described above, in accordance with the specific embodiment of the present invention, the hard mask made of tungsten is omitted and thus, the whole semiconductor device fabrication method becomes simplified. Also, the line width of the bit line pattern is increased by using the polymers generated during the etching process.

Accordingly, it is possible to improve an etch margin due to the polymers and obtain the bit line pattern precisely aligned with the subsequent metal interconnection contact plug.

The present application contains subject matter related to the Korean patent application No. KR 2005-0056381, filed in the Korean Patent Office on Jun. 28, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method of fabricating a semiconductor device, comprising:
   sequentially forming etch target layers, a hard mask layer and an anti-reflective coating layer;
   selectively etching the anti-reflective coating layer and the hard mask layer using gases generating polymers, thereby increasing a line width of a bottom portion of the hard mask layer due to the polymers; and
   etching the etch target layers using the hard mask layer with the increased line width,
   wherein selectively etching the hard mask layer includes using a gas mixture including at least one of $CF_4$ and $CHF_3$ with at least one of $N_xH_y$ gas and $C_xH_y$ gas, wherein x and y represent atomic ratios and are positive numbers, and
   wherein selectively etching the anti-reflective coating layer and the hard mask layer includes implementing a process condition that a temperature of a top electrode is different from a temperature of a bottom electrode to make sidewalls of the anti-reflective coating layer and the hard mask layer have a sloped profile.

2. The method of claim 1, wherein the etch target layers includes a first bit line in a cell region and a second bit line in a peripheral circuit region.

3. The method of claim 2, wherein a line width of the first bit line is larger than that of the second bit line.

4. The method of claim 1, wherein the selective etching of the anti-reflective coating layer comprises using a gas mixture including nitrogen ($N_2$), oxygen ($O_2$) and carbon monoxide (CO).

5. The method of claim 1, wherein during the selective etching of the anti-reflective layer and the hard mask layer, the polymers are adsorbed onto the sidewalls of the anti-reflective coating layer and the hard mask layer.

6. The method of claim 1, wherein the temperature of the top electrode ranges from approximately 100° C. to approximately 150° C. and the temperature of the bottom electrode ranges from approximately 30° C. to approximately 50° C.

7. The method of claim 1, wherein the hard mask layer is a nitride-based material.

* * * * *